United States Patent [19]

Gaschler et al.

[11] Patent Number: 5,227,281
[45] Date of Patent: Jul. 13, 1993

[54] PROCESS FOR PRODUCING NEGATIVE COPIES

[75] Inventors: Otfried Gaschler, Weisbaden; Andreas Elsaesser, Idstein; Dieter Mohr, Budenheim; Hans W. Frass, Wiesbaden, all of Fed. Rep. of Germany

[73] Assignee: Hoechst Aktiengesellschaft, Franktfurt am Main, Fed. Rep. of Germany

[21] Appl. No.: 625,542

[22] Filed: Dec. 11, 1990

[30] Foreign Application Priority Data

Dec. 12, 1989 [DE] Fed. Rep. of Germany ....... 3940911

[51] Int. Cl.$^5$ .................................................. G03F 7/30
[52] U.S. Cl. ...................................... 430/325; 430/328; 430/330
[58] Field of Search .......................... 430/325, 328, 330

[56] References Cited

U.S. PATENT DOCUMENTS

| | | | |
|---|---|---|---|
| 3,779,778 | 12/1973 | Smith et al. | 96/115 R |
| 3,869,292 | 3/1975 | Peters | 96/115 R |
| 4,104,070 | 8/1978 | Mortiz et al. | 96/36 |
| 4,189,323 | 2/1980 | Buhr | 430/281 |
| 4,196,003 | 4/1980 | Watanabe | 430/193 |
| 4,212,970 | 7/1980 | Iwasaki | 542/455 |
| 4,248,957 | 3/1981 | Sander et al. | 430/270 |
| 4,311,782 | 1/1982 | Buhr et al. | 430/270 |
| 4,506,006 | 3/1985 | Ruckert | 430/325 |
| 4,568,631 | 2/1986 | Badami et al. | 430/325 |
| 4,576,901 | 3/1986 | Stahlhofen et al. | 430/325 |
| 4,581,321 | 4/1986 | Stahlhofen | 430/325 |
| 4,696,891 | 9/1987 | Guzzi | 430/325 |
| 4,775,609 | 10/1988 | McFarland | 430/325 |
| 4,889,788 | 12/1989 | Stahlhofen et al. | 430/191 |
| 4,910,119 | 3/1990 | Schneller et al. | 430/192 |
| 4,927,741 | 5/1990 | Garth et al. | 430/325 |
| 4,931,381 | 6/1990 | Spak et al. | 430/328 |

FOREIGN PATENT DOCUMENTS

| | | |
|---|---|---|
| 0178594 | 4/1986 | European Pat. Off. . |
| 0187517 | 7/1986 | European Pat. Off. . |
| 2529054 | 6/1977 | Fed. Rep. of Germany . |
| 3711263 | 10/1988 | Fed. Rep. of Germany . |
| 3715790 | 11/1988 | Fed. Rep. of Germany . |
| 739654 | 11/1955 | United Kingdom . |
| 1154749 | 6/1969 | United Kingdom . |
| 2082339 | 3/1982 | United Kingdom . |
| 2171530 | 8/1986 | United Kingdom . |
| 2188448 | 9/1987 | United Kingdom . |
| WO88/07705 | 10/1988 | World Int. Prop. O. . |

OTHER PUBLICATIONS

MacDonald et al., "Image Reversal; The Production of a Negative Image in a Positive Photoresist", Interface 82, San Diego 1982, pp. 1-6.
Patent Abstracts of Japan, vol. 11, No. 299 (P-621) [2746], Sep. 29, 1987.

*Primary Examiner*—Marion E. McCamish
*Assistant Examiner*—Christopher D. RoDee
*Attorney, Agent, or Firm*—Foley & Lardner

[57] ABSTRACT

A process for producing negative copies is disclosed in which a light-sensitive or radiation-sensitive recording material comprising a layer support and a normally positive-working light-sensitive or radiation-sensitive layer applied thereto is irradiated imagewise, thermally treated, irradiated overall and then developed with an alkaline developer. Thermal treatment is carried out with water or with an aqueous solution, at temperatures in the range from about 50° to 100° C., preferably from 60° to 90° C., within a period of time varying between about 1 second and 5 minutes, preferably between 5 seconds and 1 minute, overall irradiation is performed on the optionally still hot recording material and development is thereafter carried out within a period of time varying between about 10 seconds and 2 minutes, preferably between 15 seconds and 1 minute. The process can be carried out according to the customary procedure known in the practice of positive processing, and results in perfect printing stencils.

12 Claims, No Drawings

PROCESS FOR PRODUCING NEGATIVE COPIES

BACKGROUND OF THE INVENTION

The present invention relates to a process for producing negative copies with a light-sensitive or radiation-sensitive recording material comprising a layer support and a normally positive-working light-sensitive or radiation-sensitive layer. The normally positive-working layer contains, as essential constituents, a 1,2-quinone diazide and/or a mixture of a compound forming a strong acid under the action of actinic radiation and a compound having at least one acid-cleavable C-O-C group. The layer is irradiated imagewise, thermally treated, irradiated overall and then developed with an alkaline developer.

Positive-working light-sensitive compositions, in which the imagewise-irradiated areas become soluble and the non-exposed areas remain insoluble, are known in the art. Layers that are primarily used in practice to prepare materials of this kind have o-quinone diazides as the light-perfect sensitive compounds, and additionally contain resins with groups rendering them alkali-soluble, for example, phenolic resins.

Light-sensitive compositions based on acid-cleavable compounds are also known. The acid-cleavable compounds contained in these compositions comprise orthocarboxylic acid derivatives, monomeric or polymeric acetals, enol ethers or acylimino carbonates. As the radiation-sensitive compounds which split off acid the compositions usually contain organic halogen compounds, in particular s-triazines substituted by halomethyl groups. The binders employed also comprise resins having groups which render them alkali-soluble.

It is also known that a normally positive-working copying material based on an o-quinone diazide, in the presence of appropriate additives, can be used as a negative-working copying material by employing a particular sequence of treatments. GB 2 082 339 describes a reversal process of this kind, in which a light-sensitive composition comprising an o-quinone diazide and at least one resol is used as a negative-working recording material. DE 25 29 054, corresponding to U.S. Pat. No. 4,104,070, discloses resist layers based on 1,2-quinone diazides and containing a hydroxyethylimidazoline as an additive, for use in a reversal process. A similar material containing secondary or tertiary amines is described in U.S. Pat. No. 4,196,003. In the reversal process specified in EP 133 216, corresponding to U.S. Pat. No. 4,581,321, the additive contained in the o-quinone-diazide-containing copying layer comprises a hexamethylol melamine ether which is preferably used as a crosslinking agent in polymer reactions. EP 131 238, corresponding to U.S. Pat. No. 4,576,901, on the other hand, describes a reversal process, in which the light-sensitive material does not require any of the above-indicated basic or acidic additives. DE 37 11 263 and 37 25 949 disclose various s-triazine derivatives for use as substances which promote thermal hardening in reversal processes using normally positive-working formulations. From EP 082 463, corresponding to U.S. Pat. No. 4,506,006, a positive/negative reversal process is also known, which uses acid-cleavable compounds instead of 1,2-quinone diazides.

The known reversal processes basically comprise the same sequence of processing steps, i.e., the printing plate is heated after imagewise exposure, after cooling reexposed without original and then developed by means of an aqueous-alkaline developer. They are based on the fact that the light decomposition products produced form an insoluble reaction product upon heating. This thermal secondary reaction usually takes place in the presence of particular basic or acidic additives in the copying layer or in the presence of particular crosslinking agents containing multifunctional reactive groups.

For practical applications it is very important that the individual processing steps can be reliably performed and that, for example, imagewise irradiation, heating for image reversal, cooling, reexposure and development correspond to the conventional processing steps. A sufficient image reversal latitude should be ensured. The term "image reversal latitude" denotes the temperature range within which conversion can be carried out or the tolerance range of the time required for conversion.

The additives which have been described for compositions based on 1,2-quinone diazides can be classified as additives which, in the presence of the acid produced during irradiation, cause a thermal crosslinking reaction in the light-sensitive composition and basic additives which react to form a salt with the acid produced during irradiation and thus reduce the energy required for decarboxylating the acid (C. G. Willson: "Image Reversal: The Production of a Negative Image in a Positive Photoresist", Interface 82, San Diego 1982).

In a special embodiment, the additive used to extend the image reversal latitude is not a priori present in the radiation-sensitive layer, but is applied between the steps of imagewise exposure and thermal treatment, for example, by exposing the material to an ammonia atmosphere, as described, for example, in DE 35 41 451 and U.S. Pat. No. 4,775,609.

In the reversal treatment of a copying material, imagewise irradiation or exposure under an original is followed by heating without any further intermediate treatment, as is known. Heating can be carried out by irradiation, convection, contacting with heated surfaces, for example, rolls, or immersing into a heated bath of an inert liquid. The heating temperature varies in particular between 110° and 140° C. The heating step is followed by cooling the material to room temperature. Although the compositions generally withstand these temperatures it has, nevertheless, been found that thermal treatment gives rise to a fundamental disadvantage of this reversal processing, since it adversely influences the developing behavior of the radiation-sensitive layer. Developing times are, for example, usually markedly increased. In the case of mechanical processing according to fixed cycle times, this has the consequence that processing speeds, and thus plate throughput, must be considerably reduced and that, in some cases, reliable development is no longer possible, even at the lowest processing speeds.

To obviate this adverse influence of thermal treatment in an oven, it has already been proposed to carry out overall exposure under water (GB 2 188 448). This procedure eliminates the problems occurring in the development step. However, since construction of the apparatus required is difficult this solution is not yet practical.

SUMMARY OF THE INVENTION

It is therefore an object of the present invention to provide a process, in which reversal processing is possible without giving rise to the above-described problems in the development step and in which a simpler apparatus can be used than was hitherto possible.

These and other objects according to the invention are achieved by a process for producing negative copies from a light-sensitive or radiation-sensitive recording material comprising a layer support and a normally positive-working light-sensitive or radiation-sensitive layer applied thereto which contains at least one of a 1,2-quinone diazide and a mixture of a component forming a strong acid under the action of actinic radiation and a compound having at least one acid-cleavable C—O—C group, comprising the steps of imagewise irradiating the layer, thermally treating the imagewise-irradiated layer with water or an aqueous solution, at temperatures in the range from about 50° to 100° C., for a period of time between about 1 second and 5 minutes, overall irradiating the layer which is optionally still hot, and then developing the layer with an alkaline developer for a period of time between about 10 seconds and 2 minutes.

Other objects, features and advantages of the present invention will become apparent from the following detailed description. It should be understood, however, that the detailed description and the specific examples, while indicating preferred embodiments of the invention, are given by way of illustration only, since various changes and modifications within the spirit and scope of the invention will become apparent to those skilled in the art from this detailed description.

DESCRIPTION OF THE PREFERRED EMBODIMENTS

In the process according to the present invention, a recording material is thermally treated with water or with an aqueous solution at temperatures in the range from about 50° to 100° C. for a period of time varying between about 1 second and 5 minutes, the recording material is irradiated overall while optionally still hot and thereafter developed for a period of time varying between about 10 seconds and 2 minutes. Preferably thermal treatment is carried out in the temperature range from about 60° to 90° C. for a period of time varying between about 5 seconds and 1 minute and development for a period between about 15 seconds and 1 minute.

The process according to the invention can, for example, be carried out in such a way that the exposed recording material is treated with the hot aqueous solution in a dip tank, passes through a bath equipped with a baffle or a hot immersion bath, is sprayed through nozzles, or is exposed to the aerosol of the hot aqueous solution, for example, in a chamber. Combinations of these application methods are also feasible.

The optimum time of action and temperature of the aqueous solution within the ranges described can readily be determined in each individual case, and are dependent upon the composition of the radiation-sensitive layer. In addition, the composition of the aqueous solution and the kind of layer support used for the radiation-sensitive layer are also important. In general, it can be stated that this kind of conversion surprisingly can be effected at considerably lower temperatures and shorter times of action than the conventional process using hot air in a hot air oven.

An aqueous solution which can be employed in accordance with the present invention is understood to mean a solution containing at least 10% by weight of water. It is also advantageous for such a solution to contain a number of additives. For example, the solution can contain at least one surface-active substance which serves to adjust its surface tension In particular in the case of spray application surface tensions should be about 50 mN/m or less to ensure rapid wetting of the copying layer. Suitable surfactants include cationic, anionic and non-ionic surfactants or combinations of surfactants and also surfactants of the betaine type. In surfactants containing basic units, such as polyether units, amide, amine or quaternary ammonium units, the conversion behavior is often positively influenced. When selecting the surfactants or solvents, or any other additive to the aqueous solution, care has to be taken to use one which does not cause substantial erosion of the copying layer during the conversion process. This can rapidly be determined in preliminary tests.

The aqueous solution used according to the present invention can also advantageously contain basic or acidic substances for adjusting the pH value. The optimum pH of the aqueous solution employed for conversion depends on the composition of the copying layer. In the case of copying layers comprising 1,2-quinone diazides which do not contain any further additives to facilitate reversal processing, it is advantageous to add basic substances. These substances may be inorganic or organic. The possible pH varies between 1 and 13. If the medium used is relatively acidic the layer supports are often attacked or the copying layer is attacked, presumably by protonation of basic components in the copying layer When a medium that is more on the alkaline side is used, an increased attack of the copying layer occurs by conversion of the phenolic resin binder into the anionic form. The preferred pH range varies between 5 and 8.

To stabilize the pH, buffer substances are expediently added to the aqueous solution. This measure results, on the one hand, in an increased yield of the solution used for conversion, since compounds dissolved out of the copying layer tend to shift the pH and, on the other hand, in more consistent results. Suitable buffers are well-known in the art. The aqueous solution is appropriately buffered in a pH range from 5 to 8.

It is also advantageous for the aqueous solution to contain complexing agents. The latter prevent the formation of deposits if non-demineralized water is used. This is particularly important in view of the fact that different users employ widely varying types of water.

It is also possible to add substances to the aqueous solution, which influence, for example, increase, the viscosity of the solution, as far as this should be required by the procedure chosen for applying the conversion solution. Water-soluble polymers are used, in particular, to increase viscosity.

In addition, the aqueous solution used according to the present invention can advantageously contain substances to increase the heat conductivity of the solution. By means of rapid heat transfer to the recording material it is possible to attain short conversion times. This is achieved in a simple manner by raising the salt content of the solution. If necessary, the aqueous solution can also contain defoamers and substances which reduce the vapor pressure of the aqueous solution.

According to the present invention, thermal treatment in the low temperature range from about 50° to 100° C., preferably from about 60° to 90° C., does not give rise to any impairment of function in the overall exposure of the still hot plate, so that development with an aqueous-alkaline developer can be carried out within a period of about 10 seconds to 2 minutes, preferably about 5 seconds to 1 minute, which is the range usually employed in practice and does not require any special measures, compared with processing of a normally positive-working printing plate.

This result was entirely unexpected, since it was impossible to assume that a) conversion would be successful under relatively mild conditions and b) the problems existing in the development of a plate exposed overall in the still hot state could be overcome.

The 1,2-quinone diazides used preferably comprise 1,2-naphthoquinone-2-diazide-4-sulfonic acid or -5-sulfonic acid esters or amides or carboxylic acid esters or amides. Suitable compounds of this kind are known and described, for example, in DE 938 233, corresponding to GB 739 654.

The amount of 1,2-quinone diazide compounds used generally ranges from about 3 to 50% by weight, preferably from about 7 to 35% by weight, relative to total solids of the light-sensitive or radiation-sensitive composition Acid-cleavable compounds which may be mentioned include:
a) those having at least one orthocarboxylic ester and/or carboxamide acetal grouping, it also being possible for the compounds to have polymeric character and for the groupings mentioned to be present as linking elements in the main chain or as pendant substituents,
b) oligomeric or polymeric compounds having recurring acetal and/or ketal groupings in the main chain, and
c) compounds having at least one enol ether or N-acylimino-carbonate grouping.

Acid-cleavable compounds of type a) as components of radiation-sensitive compositions are described in EP 022 571, corresponding to U.S. Pat. No. 4,311,782; compositions containing compounds of type b) are described in DE 23 06 248, corresponding to U.S. Pat. No. 3,779,778; compounds of type c) are disclosed in EP 006 627, corresponding to U.S. Pat. No. 4,248,957.

A large number of known compounds and mixtures of compounds are suitable for use as light-sensitive components which form a strong acid upon exposure. Examples are phosphonium, sulfonium and iodonium salts, halogen compounds and organometal/organohalogen combinations.

The phosphonium, sulfonium and iodonium compounds mentioned are usually employed in the form of their salts, which are soluble in organic solvents, in most cases in the form of precipitation products, hexafluorophosphoric, hexafluoroantimonic and hexafluoroarsenic acid.

As the halogen-containing light-sensitive compounds which form hydrohalogenic acid, any organic halogen compounds can basically be used, which are also known as photochemical free-radical initiators, for example, those which have at least one halogen atom on a carbon atom or on an aromatic ring. Of these compounds, the s-triazine derivatives are preferred which contain methyl halide groups, in particular, trichloromethyl groups, and an aromatic or unsaturated substituent, respectively, in the triazine nucleus, as described in DE 27 18 259, corresponding to U.S. Pat. No. 4,189,323. Also suitable are 2-trihalomethyl-5-vinyl-1,3,4-oxadiazoles (DE 28 51 471, corresponding to U.S. Pat. No. 4,212,970). The effect of these halogen-containing compounds can also be spectrally influenced and enhanced by known sensitizers.

Examples of suitable photochemical acid donors are:
4-methyl-6-trichloromethyl-2-pyrone,
4-(3,4,5-trimethoxystyryl)-6-trichloromethyl-2-pyrone,
4-(4-methoxystyryl)-6-(3,3,3,-trichloropropenyl)-2-pyrone,
2-trichloromethylbenzimidazole,
2-tribromomethylquinoline,
2,4-dimethyl-1-tribromoacetyl-benzoic acid,
1,4-bis-dibromomethylbenzene,
tris-dibromomethyl-s-triazine,
2-(6-methoxynaphth-2-yl)-,
2-(naphth-1-yl)-,
2-(4-ethoxyethyl-naphth-1-yl)-,
2-(benzopyran-3-yl)-,
2-(4-methoxyanthrac-1-yl)-,
2-(4-styrylphenyl)-,
2-(phenanthr-9-yl)-4,6-bis-trichloromethyl-striazine,
and the compounds specified in the examples.

The quantity of the photochemical acid donor can also vary widely depending on its chemical nature and on the composition of the layer. Favorable results are obtained using from about 0.5 to 20% by weight, preferably from about 1.0 to 12% by weight, based on the total solids of the composition. In particular, in light-sensitive layers having thicknesses over 0.01 mm, it is advisable to use a relatively small amount of acid donor.

The binders used comprise polycondensation products or polymers having free phenolic hydroxyl groups, the content of phenolic hydroxyl groups preferably ranging from about 2 to 9 mmol/g of binder. Examples of polycondensation products are phenolic resins of the novolak type or hydroxyl-substituted aramides. Examples of polymers include homopolymers and copolymers of vinylphenols (DE 23 22 230, corresponding to U.S. Pat. No. 3,869,292), polymers of the esters of acrylic acid with phenols (EP 212 439) or copolymers of hydroxyphenyl-maleic imides (EP 187 517). The quantity of binder generally varies from about 20 to 90% by weight, preferably from about 50 to 85% by weight, based on the non-volatile components of the composition.

A great number of other oligomers and polymers can additionally be employed, for example, vinyl polymers, such as polyvinyl acetals, polymethacrylates, polyacrylates, polyvinyl ethers and polyvinyl pyrrolidones, which themselves may be modified by comonomers.

The most favorable quantity of these additives depends on application-related requirements and on their influence on development conditions and generally does not exceed about 20% by weight of the binder containing phenolic side groups. To meet special requirements, such as flexibility, adhesion, gloss, etc., the light-sensitive layer can also contain small amounts of substances, such as polyglycols, cellulose ethers, e.g., ethyl cellulose, wetting agents and finely-divided pigments.

In addition, soluble or finely-divided dispersible dyes and, depending on the particular application, UV-absorbers, may be added to the light-sensitive compositions. Moreover, compositions based on 1,2-quinone diazides, that should offer a wide image reversal latitude in the positive-negative conversion, may contain at least one of the additives used to extend the image reversal latitude, which have been described in detail above.

For coating a suitable support, the compositions are usually dissolved in a solvent. The selection of solvents depends on the intended coating process, the layer thickness and the drying conditions. Suitable solvents for the composition of the invention include ketones, such as methyl ethyl ketone; chlorinated hydrocarbons, such as trichloroethylene and 1,1,1-trichloroethane; alcohols, such as n-propanol; ethers, such as tetrahydrofuran; alcohol ethers, such as ethylene glycol monoethyl ether; and esters, such as butyl acetate. It is also possible to use mixtures which, for special purposes, may additionally contain solvents, such as acetonitrile, dioxane or dimethyl formamide. In principle any solvents can be used that do not irreversibly react with the layer components. Partial ethers of glycols, in particular, ethylene glycol monomethyl ether and propylene glycol monomethyl ether, used alone or in mixtures, are particularly preferred.

In most cases, the supports used for layer thicknesses of less than about 10 μm are metals. The following can be used for offset printing plates: mill-finished, mechanically and/or electrochemically grained and optionally anodically oxidized aluminum, which additionally may have been chemically pretreated, for example, with polyvinylphosphonic acid, silicates, phosphates, hexafluorozirconates or with hydrolyzed tetraethyl orthosilicate.

Coating of the support is carried out in a known manner by means of spin-coating, spraying, dipping, roller-coating, application with slot dies, blade-spreading or flow-coater application.

For exposure, the customary light-sources can be used, for example, tubular lamps, pulsed xenon lamps, metal halide-doped high-pressure mercury vapor lamps and carbon arc lamps.

In this specification, the terms "exposure" and "irradiation" are meant to denote the action of actinic electromagnetic radiation in the wavelength range below about 500 nm. Any sources of radiation which emit in this wavelength range can generally be used, in particular automatic processors which contain an argon ion laser or a krypton ion laser as the source of radiation. Irradiation by means of electron beams is also possible, and even X-rays can be used to form an image.

The imagewise-exposed or -irradiated layer and the overall-exposed layer can be removed in a known manner, using practically the same developers as those known for use with commercial naphthoquinone diazide layers and resists, or the copying behavior of the materials according to the present invention can readily be adapted to the conventional auxiliaries, such as developers and programmed spray processors. The aqueous developer solutions can contain, for example, alkali metal phosphates, silicates or hydroxides and, in addition, wetting agents and optionally minor amounts of organic solvents. In specific cases, solvent/water mixtures can also be used as developers. The most favorable developer can be determined by tests carried out on the layer used in each case. If required, development can be mechanically assisted.

When the material is used for the preparation of printing plates, stability in the printing process and resistance to wash-out solutions, deletion fluids and UV-hardenable printing inks can be improved by heating the developed plates for a short time at elevated temperatures, as described for diazo layers in GB 1,154,749.

In the following examples preferred embodiments of the process according to the invention are described In the examples parts by weight (pbw) and parts by volume (pbv) are related as g to cm². Percentages and quantitative ratios are to be understood as units of weight, unless otherwise specified.

EXAMPLE 1

A coating solution is prepared from 8.0 pbw of an m-cresol-formaldehyde novolak having an average molecular weight of 6,000, 1.6 pbw of the esterification product of 1 mol of 1,2-naphtho-quinone-2-diazide-4-sulfonyl chloride and 1 mol of p-cumylphenol, 0.4 pbw of 2,4-diethoxy-6-diethylamino-s-triazine, according to DE 37 11 263, as a base, 0.1 pbw of Crystal Violet (C.I. 42 555)

0.02 pbw of Sudan Yellow (C.I. 11 021) and 100 pbw of a solvent mixture of tetrahydrofuran and propylene glycol monomethyl ether (55:45).

This solution is spin-coated onto an aluminum foil which has been grained in hydrochloric acid, anodized in sulfuric acid and rendered hydrophilic by means of polyvinylphosphonic acid. Drying for 2 minutes at 100° C. results in a layer thickness of 2 μm.

The printing plates are exposed for 65 seconds through a continuous-tone step wedge having 13 density steps of 0.15 each (exposure wedge "BK 01" of HOECHST AG), under a 5 kW metal halide lamp disposed at a distance of 110 cm, converted by treating for 1 minute at various temperatures in an immersion bath filled with fully demineralized water or in a circulating-air oven and, without allowing to cool, exposed overall for 45 seconds and then developed for 1 minute (this corresponds to normal development) in the following developer:

8.5 pbw of $Na_2SiO_3 \times 9\ H_2O$, 0.8 pbw of NaOH, and 1.5 pbw of $Na_2B_4O_7 \times 10\ H_2O$, in 89.2 pbw of $H_2O$.

Tables 1a and 1b indicate the solid steps found in the reproduction of the continuous-tone wedge, as a function of conversion temperature, up to the step which is the first to show scumming.

In addition, Tables 1a and 1b show the results of a short-time development (15 seconds) carried out in each case. By inking with a black offset ink it can be determined whether the copying layer has been completely removed in the non-image areas (scum-free) or is still partially present and takes printing ink (scums).

TABLE 1a

| | Conversion in a Circulating-Air Oven | |
|---|---|---|
| Temperature [°C.] | Reproduction after normal development (1 minute) | Reproduction after short-time development (15 seconds) |
| 80 | — | scums |
| 90 | –3 | " |
| 100 | 1–3 | " |
| 110 | 1–3 | " |
| 120 | 1–4 | " |
| 130 | 1–4 | " |
| 140 | 1–4 | " |
| 150 | 1–5 | " |

TABLE 1b

| | Conversion in a Water Bath | |
|---|---|---|
| Temperature [°C.] | Reproduction after normal development (1 minute) | Reproduction after short-time development (15 seconds) |
| 50 | — | scum-free |

TABLE 1b-continued

<table>
<tr><th colspan="3">Conversion in a Water Bath</th></tr>
<tr><th>Temperature [°C.]</th><th>Reproduction after normal development (1 minute)</th><th>Reproduction after short-time development (15 seconds)</th></tr>
<tr><td>60</td><td>-3</td><td>"</td></tr>
<tr><td>70</td><td>1-4</td><td>"</td></tr>
<tr><td>80</td><td>1-4</td><td>"</td></tr>
<tr><td>90</td><td>1-5</td><td>"</td></tr>
<tr><td>100</td><td>1-6</td><td>"</td></tr>
</table>

The results show that in the case of conversion in a water bath, even at a distinctly lower temperature, the reproduction obtained is comparable to that resulting after converting in a circulating-air oven, while the behavior upon short-time development without the customary cooling is considerably improved over the entire applicable temperature range.

To complete the short-time development tests, the following test series was carried out:

After converting at 75° C. in a water bath or at 125° C. in the circulating-air oven, followed by an otherwise identical procedure, dip-tank development at intervals of 5 seconds was used to determine the minimum developing time, i.e., the time after which the non-image areas are for the first time free of scumming. The results are compiled in Table 2.

TABLE 2

| Conversion medium | Conversion temperature (°C.) | Minimum developing time (secs) |
|---|---|---|
| hot air | 125° | 35 |
| water | 75° | 10 |

In addition, the influence of the conversion process on a possible subsequent positive processing was examined, which is important in view of photocomposing. For this purpose, the normal exposure time of positive processing according to copying table 2 of FOGRA and also the resistance of the unexposed copying layer to the developer solution used were determined without pretreatment and after treating for 1 minute with hot air or hot water (Table 3).

TABLE 3

| Medium | Temperature [°C.] | Normal exposure time [seconds] | Resistance to developer [minutes] |
|---|---|---|---|
|  | — | 65 | >4 |
| hot air | 125 | 55 | >4 |
| water | 60 | 55 | >4 |
| water | 70 | 55 | >4 |
| water | 80 | 55 | >4 |
| water | 90 | 55 | >4 |

The results show that photocomposing is possible also when this converting process has been used.

To determine the minimum conversion time, the following experiment was performed: The printing plates were exposed for 65 seconds, thereafter thermally treated at 80° C. in a water bath or at 135° C. in a circulating air oven for different periods of time and, without cooling, exposed for 45 seconds without original and developed for 1 minute.

Table 4 below indicates the reproductions of the continuous-tone wedge which were obtained.

TABLE 4

| Conversion time [seconds] | Reproduction of continuous-tone wedge | |
|---|---|---|
| | water bath | circulating-air oven |
| 15 | -4 | — |
| 20 | -4 | — |
| 30 | 1-4 | -3 |
| 40 | 1-5 | -3 |
| 50 | 1-5 | 1-3 |
| 60 | 1-5 | 1-3 |

As shown by the results, thermal treatment in a water bath is also advantageous in view of conversion time.

EXAMPLE 2

Reversal processing according to Example 1 was repeated, but instead of fully-demineralized water aqueous solutions of various surfactants were sprayed on and baffled. The temperature chosen was always 75° C., the conversion time of the solutions was 1 minute. The results are compiled in Table 5.

TABLE 5

| Addition [quantity] | Characterization | Reproduction after normal development [1 minute] | Reproduction after short-time development [15 seconds] |
|---|---|---|---|
| — | comparison | 1-4 | scum-free |
| FT 448 [0.05%] | anionic | 1-4 | scum-free |
| FT 719 [0.05%] | non-ionic | 1-4 | scum-free |
| FT 738 [0.05%] | cationic | 1-4 | scum-free |

The surfactants used were fluorine surfactants supplied by Bayer AG.

The solutions containing surfactants definitely exhibited less problematic wetting behavior with respect to the copying layer. Adverse influences on reversal processing could not be found.

EXAMPLE 3

Reversal processing according to Example 1 was repeated, but instead of fully-demineralized water, solutions were used which had been adjusted to different pH values by adding sulfuric acid or sodium silicate.

Conversion was carried out in an immersion bath for 1 minute, at a temperature of 75° C. See Table 6.

TABLE 6

| pH | Reproduction after normal development [1 minute] | Short-time development [15 seconds] | Normal positive exposure time after converting |
|---|---|---|---|
| 2.3 | 1-4 | scum-free | 55 |
| 3.5 | 1-4 | scum-free | 55 |
| 5.0 | 1-4 | scum-free | 55 |
| 7.2 | 1-4 | scum-free | 55 |
| 9.0 | 1-4 | scum-free | 50 |

The results show that reversal behavior is constant over a wide pH range.

EXAMPLE 4

Reversal processing according to Example 1 was carried out using buffered or non-buffered aqueous solutions and tests were made to find out whether an increasing load (final value: 1 m² of converted layer per liter of aqueous solution) leads to a change in reversal processing (Table 7). Temperature: 75° C.; time: 1 minute.

TABLE 7

| Buffer system | pH at the outset | pH upon stopping of tests | Reproduction at the outset | Reproduction upon stopping tests |
|---|---|---|---|---|
| | | | in the case of normal development | |
| | 7.00 | 6.31 | 1–4 | 1–4 |
| phthalic acid/ potassium phthalate | 5.12 | 5.12 | 1–4 | 1–4 |
| $K_2HPO_4/KH_2PO_4$ | 6.34 | 6.34 | 1–4 | 1–4 |
| $Cl^-$—$H_3^+NC(CH_2OH)_3/$ $H_2N$—$C(CH_2OH)_3$ | 7.50 | 7.5 | 1–4 | 1–4 |

EXAMPLE 5

A coating solution is prepared as in Example 1, but without the addition of 2,4-diethoxy-6-diethylamino-s-triazine as a base. The solution is coated upon an aluminum foil treated according to Example 1 to give a dry thickness of 2 μm and the dry layer is then exposed.

Exposing, reversal processing and developing correspond to the procedure described in Example 1. Conversion is carried out in fully-demineralized water, and for developing a 5% strength solution of triethylenetetramine is used; conversion time is 1 minute and developing time is 30 seconds.

TABLE 8

| Converting temperature [°C.] | Reproduction after normal development | Converting in fully demineralized water | Converting in basic solution |
|---|---|---|---|
| 75 | — | — | –3 |
| 80 | — | –3 | 1–4 |
| 95 | — | 1–4 | 1–4 |

The example shows that the image reversal latitude can be extended, even by adding a basic substance to the converting solution.

EXAMPLE 6

Coating solutions were prepared from:
5 pbw of a high-polymer of 2-hydroxyphenyl-methacrylate having a molecular weight of 20,000,
1.4 pbw of an oligomeric acetal, obtained by polycondensation of triethyleneglycol and 2-ethyl-butyraldehyde, hydroxyl number 140,
0.2 pbw of 2-(4-styrylphenyl)-4,6-bistrichloromethyl-s-triazine,
0.03 pbw of Crystal Violet (C.I. 42 555),
100 pbw of the solvent mixture used in Example 1.

These solutions were spin-coated onto aluminum sheets which had been pretreated as in Example 1. After drying for 2 minutes at 100° C. a layer thickness of 2.5 μm was obtained. This copying layer was then coated from an aqueous solution with an 0.2 μm thick non-light-sensitive cover layer of polyvinyl alcohols (K-value 4, content of residual acetyl groups: 12%), according to DE 37 15 790).

This material was used for reversal processing:

| | |
|---|---|
| Exposure through continuous-tone step wedge: | 20 seconds |
| Conversion: | 1 minute hot air at 130° C. or 1 minute fully demineralized water bath at 90° C. |
| Exposure without original and without previous cooling: | 20 seconds |

Development for 30 seconds in the following developer:
5.3 pbw of sodium silicate×9 $H_2O$,
3.4 pbw of trisodium phosphate×12 $H_2O$,
0.3 pbw of sodium hydrogenphosphate (anhydrous),
91.0 pbw of water.

In both cases steps 1 to 3 are reproduced.

The example shows that the process according to the present invention is also suitable for use in the reversal processing of materials based on acid-cleavable C—O—C bonds.

EXAMPLE 7

Coating solutions were prepared from:
5 pbw of the polymeric binder of Example 6,
0.5 pbw of an esterification product of 3 mols of 1,2-naphthoquinone-2-diazide-4-sulfonylchloride and 1 mol of 2,3,4-trihydroxybenzo-phenone,
1.2 pwb of the oligomeric acetal of Example 6,
0.15 pbw of 2-(4-styrylphenyl)-4,6-bistrichloro-methyl-s-triazine,
0.03 pbw of the dye described in Example 6,
100 pbw of the solvent mixture of Example 1.

These solutions were applied to aluminum sheets which had been pretreated as described in Example 1, such that the layer thickness obtained after drying for 2 minutes at 100° C. was 2,000 nm. This copying layer was coated with a cover layer of polyvinyl alcohol, as in Example 6.

Exposure, reversal processing and development were carried out exactly as described in Example 6.

Conversion with hot air and conversion with hot water both result in the reproduction of steps 1 to 3.

The example shows that the process according to the present invention is also suitable for the reversal processing of hybrid materials, the light-sensitive layers of which contain 1,2-quinone-diazides and combinations of compounds having acid-cleavable C—O—C groups and compounds forming a strong acid upon exposure.

EXAMPLE 8

Reversal processing according to Example 1 was repeated, except that various glycerol/water mixtures were used instead of fully-demineralized water. Conversion was carried out in an immersion bath for 15 seconds. The temperature used and the results obtained with the developer of Example 1 are indicated in Table 9.

TABLE 9

| Mixing ratio glycerol:water 177° C. | | Temperature [°C.] | Short-time development [15 seconds] | Reproduction after developing time of 30 seconds |
|---|---|---|---|---|
| 10 | 0 | 75 | scums | scums |
| 9 | 1 | 75 | scum-free | 1–5 |
| 8 | 2 | 75 | scum-free | 1–5 |
| 7 | 3 | 75 | scum-free | 1–5 |

What is claimed is:

1. A process for producing negative copies from a light-sensitive or radiation-sensitive recording material comprising a layer support and a normally positive-working light-sensitive or radiation-sensitive layer applied thereto which contains at least one of:
   a 1,2-quinone diazide, and
   a mixture of a component forming a strong acid under the action of actinic radiation and a compound having at least one acid-cleavable C—O—C group, the process comprising the steps of:
   imagewise irradiating the layer;
   thermally treating the imagewise-irradiated layer with water or an aqueous solution, at temperatures in the range from about 50° to 100° C., for a period of time between about 1 second and 5 minutes;
   beginning overall irradiation of the layer without allowing the layer to cool;
   overall irradiating the layer to produce a negative latent image; and then
   developing the layer with an alkaline developer for a period of time between about 10 seconds and 2 minutes to produce a negative image.

2. The process as claimed in claim 1, wherein thermal treatment is carried out using an aqueous solution containing at least one surface-active substance.

3. The process as claimed in claim 1, wherein the aqueous solution has a pH varying from 5 to 8.

4. The process as claimed in claim 1, wherein the aqueous solution is buffered in the pH range from 5 to 8.

5. The process as claimed in claim 1, wherein the aqueous solution contains a complexing agent.

6. The process as claimed in claim 1, wherein the aqueous solution contains an additive to increase heat conductivity.

7. The process as claimed in claim 1, wherein the aqueous solution contains a defoamer.

8. The process as claimed in claim 1, wherein the aqueous solution contains an additive to increase viscosity.

9. The process as claimed in claim 1, wherein development is carried out for a period of time between about 15 seconds and 1 minute.

10. The process as claimed in claim 1, wherein thermal treatment is carried out in the temperature range from about 60° to 90° C.

11. The process as claimed in claim 10, wherein thermal treatment is carried out for a period of time between about 5 seconds and 1 minute.

12. The process as claimed in claim 1, wherein thermal treatment is carried out for a period of time between about 5 seconds and 1 minute.

* * * * *